United States Patent
Nakayama et al.

(10) Patent No.: US 7,459,631 B2
(45) Date of Patent: Dec. 2, 2008

(54) STRUCTURE FOR HOUSING ELECTRICAL JUNCTION BOX IN HOUSING BOX

(75) Inventors: Makoto Nakayama, Shizuoka-ken (JP); Masahiro Kanamaru, Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 11/868,204

(22) Filed: Oct. 5, 2007

(65) Prior Publication Data
US 2008/0083548 A1  Apr. 10, 2008

(30) Foreign Application Priority Data
Oct. 10, 2006  (JP) ............................ P2006-276321

(51) Int. Cl.
*H05K 5/02*  (2006.01)

(52) U.S. Cl. .................. 174/50; 174/53; 174/57; 174/58; 174/60; 439/535; 33/528; 361/600

(58) Field of Classification Search ............... 174/50, 174/53, 57, 58, 60; 220/3.6, 3.8, 4.02; 439/535; 33/528; 361/600, 800, 818; 340/287
See application file for complete search history.

(56) References Cited

U.S. PATENT DOCUMENTS 5,159,156 A * 10/1992 Munk et al. .............. 174/50
5,227,581 A * 7/1993 Riviere et al. .............. 174/372
5,573,317 A * 11/1996 Cavanaugh et al. .......... 312/7.2
5,783,774 A * 7/1998 Bowman et al. ............ 174/482
6,858,802 B2 * 2/2005 Hagarty et al. ............ 174/58
7,038,132 B1 * 5/2006 Lowe et al. ............... 174/58
7,321,096 B1 * 1/2008 Huang ..................... 174/58

FOREIGN PATENT DOCUMENTS

JP  2006-61216  3/2001

* cited by examiner

*Primary Examiner*—Dhiru R Patel
(74) *Attorney, Agent, or Firm*—Finnegan, Henderson, Farabow, Garrett & Dunner, L.L.P.

(57) ABSTRACT

Provided is a structure for housing an electrical junction box in a housing box by inserting the electrical junction box into the housing box from above and also for fixing the electrical junction box to the housing box so as to prevent slipping-off thereof by engagement between engagement parts provided on external side surfaces of the electrical junction box and engagement parts provided on internal side surfaces of the housing box, both of which face each other in parallel with an insertion direction in insertion of the electrical junction box. Moreover, groove-like depressions extended along the insertion direction into the housing box are provided in the external side surfaces of the electrical junction box, and engagement convex parts are provided in the depressions. Furthermore, engagement projections engaged with the engagement convex parts are provided on the internal side surfaces of the housing box. As depressions behind the engagement convex parts in the insertion direction, die-releasing holes for injection molding for forming locking parts of the electrical junction box are used.

5 Claims, 8 Drawing Sheets

STRUCTURE FOR HOUSING ELECTRICAL JUNCTION BOX IN HOUSING BOX

BACKGROUND OF THE INVENTION

1. Field of the Invention

The present invention relates to a structure for housing in a housing box an electrical junction box mainly installed in a vehicle.

2. Description of the Related Art

As disclosed in Japanese Patent Application Laid-Open Publication No. 2001-061216, in the case where an electrical junction box is housed and fixed in a housing box, generally, first engagement parts are provided in an outer peripheral portion of the electrical junction box and second engagement parts engaged with the first engagement parts are also provided in an inner peripheral portion of the housing box.

FIG. 1 is a perspective view showing a relationship between a related electrical junction box and a housing box. FIG. 2 is a cross-sectional view showing a state where the electrical junction box is housed in the housing box when viewed from the front. FIG. 3 is an enlarged view of a section III in FIG. 2.

Reference numeral 110 denotes an electrical junction box and reference numeral 130 denotes a housing box for housing the electrical junction box 110. On the outside of the housing box 130, a fixing bracket 170 is attached for fixing the housing box 130 to a vehicle body with a bolt. The electrical junction box 110 has electric components (not shown) housed in a space formed by attaching upper and lower cases 111 and 112 to each other, which are made of resin. The housing box 130 consists of a lower cover 131 and an upper cover 132 engaged therewith so as to cover a front side of the lower cover.

The upper case 111 of the electrical junction box 110 has a rectangular box shape having a rectangular front wall 111A, upper and lower walls 111B and left and right side walls 111C. Specifically, the upper and lower walls 111B and the left and right side walls 111C are contiguously provided on four sides of the front wall 111A. On outer surfaces (external side surfaces 111Ca) of the left and right side walls 111C of the upper case 111, elastic engagement arms 117 having engagement projections 117a attached thereon and guide rails 116 and 118 which serve as a guide when the electrical junction box 110 is inserted into the housing box 130 are provided so as to project from the outer surfaces.

The guide rails 116 and 118 are disposed on both sides of the elastic engagement arms 117 so as to protect the elastic engagement arms 117. In this case, the guide rails 118 on one side are formed so as to be divided into upper and lower parts in consideration of die-releasing (a die-releasing direction is indicated by the arrow K) of an injection molding die in formation of the elastic engagement arms 117.

The lower cover 131 of the housing box 130 consists of a backside wall 131A, a lower wall 131B, left and right side walls 131C, a lower front wall 131D and left and right front walls 131E, all of which surround a space 133 for housing the electrical junction box 110. The lower cover 131 has an opening from its front center portion to its upper surface, which is not covered with the lower front wall 131D and the left and right front walls 131E. In inner surfaces (internal side surfaces 131Ca) of the left and right side walls 131C, steps (engagement parts) 137 are provided, which are engaged with the elastic engagement arms 117 of the electrical junction box 110.

When the electrical junction box 110 is housed in the housing box 130 having the configuration described above, the electrical junction box 110 is inserted into the lower cover 131 from above. Accordingly, the guide rails 116 and 118 are guided by the internal side surfaces of the lower cover 131 and thus the electrical junction box 110 is smoothly inserted into the space 133 in the lower cover 131. When the electrical junction box 110 is inserted, interference between the engagement projections 117a of the elastic engagement arms 117 and the internal side surfaces 131Ca of the lower cover 131 causes elastic deformation of the elastic engagement arms 117. Moreover, the engagement projections 117a of the elastic engagement arms 117 elastically restored by further inserting the electrical junction box 110 are engaged with the steps 137 in the internal side surfaces 131Ca of the lower cover 131. Thus, the electrical junction box 110 is locked to the lower cover 131. In this state, the upper cover 132 is placed on the lower cover 131 and locked thereto. Thus, the electrical junction box 110 can be protected in a state of being housed and fixed in the housing box 130.

In the related structure described above, the elastic engagement arms 117 are provided so as to project from the external side surfaces 111Ca of the electrical junction box 110. Thus, the elastic engagement arms 117 can be deformed or damaged when dropped or hit, particularly, during a low-temperature operation in winter. When the elastic engagement arms 117 are deformed or damaged, there is a problem that the electrical junction box 110 cannot be normally fitted into the housing box 130 or rattling occurs even if the electrical junction box 110 is fitted.

Moreover, in the case of the related structure described above, the guide rails 116 and 118 are expected to prevent deformation or damage of the elastic engagement arms 117. However, extra space is required for the projections. Thus, there arises a drawback to a demand for space-saving.

These points are equally true in the case where engagement convex parts, instead of the elastic engagement arms, are provided so as to project from the external side surfaces 111Ca of the electrical junction box 110.

Moreover, since the guide rails 118 on one side are formed in a divided pattern in consideration of die-releasing in injection molding, there may arise a problem in guiding.

SUMMARY OF THE INVENTION

The present invention was made to solve the foregoing problems of the related art. It is an object of the present invention to provide a structure for housing an electrical junction box in a housing box, which makes it possible to reduce a possibility of deformation or damage of engagement parts provided in the electrical junction box, to improve assemblability and also to meet a demand for space-saving.

An aspect of the present invention is a structure for housing an electrical junction box in a housing box, comprising: an electrical junction box; and a housing box which houses the electrical junction box by an insertion of the electrical junction box from a certain insertion direction; wherein an external side surface of the electrical junction box and an internal side surface of the housing box face each other in parallel with the insertion direction, wherein the external side surface of the electrical junction box has a groove-like depression extended along the insertion direction and an engagement convex part in the middle of an extension direction of the depression in a state where a depression is left on a rear side of the insertion direction, the engagement convex part protruding from a bottom surface of the depression and having a height not greater than a depth of the depression, wherein the internal side surface of the housing box has an internal engagement part pressed and deformed by the engagement convex part in insertion of the electrical junction box to the housing box to allow passing of the engagement convex part over the internal engagement part and engaged with a rear surface, in the insertion direction, of the engagement convex part, and wherein, when the electrical junction box is housed in the housing box, the engagement convex part and the internal engagement part are engaged with each other to prevent the electrical junction box from slipping off from the housing box.

According to the aspect of the present invention, without providing projections (such as the engagement convex part and engagement arm) directly on the external side surface of the electrical junction box, a depression extended in the insertion direction of the electrical junction box is formed in the external side surface of the electrical junction box and the engagement convex part is provided in the depression so as not to have a height greater than a depth of the depression. Thus, protrusions on the external side surface can be eliminated. Therefore, since there are no protrusions, dimensions can be reduced to contribute to space-saving. Moreover, since the engagement convex part is formed in the depression, the engagement convex part is not likely to be deformed or damaged even if the electrical junction box is dropped or hit. Thus, the electrical junction box can be normally fitted into the housing box without rattling. Moreover, it is no longer required to provide a guide rail for protecting the engagement convex part. Thus, the electrical junction box can be inserted into the housing box by using the external side surface having the depression provided therein directly as a guide surface without using a projection such as the guide rail. Consequently, there will no longer be a problem in guide performance caused by division of the guide rail due to restrictions in injection molding. As a result, assemblability is improved.

Here, a front surface, in the insertion direction, of the engagement convex part may have a sloping surface facilitating passing of the engagement convex part over the internal engagement part.

According to the configuration described above, since a sloping surface is provided on a front surface of the engagement convex part in the insertion direction, the engagement convex part can be smoothly engaged with the engagement part on the housing box. Thus, assembling workability can be improved.

Here, a die-releasing hole for injection molding for forming a specific portion of the electrical junction box may be used as the depression behind the engagement convex part in the insertion direction.

According to the configuration described above, a die-releasing hole for injection molding for forming a specific portion of the electrical junction box is used as the depression behind the engagement convex part in the insertion direction. Thus, unnecessary processing of a die can be eliminated as much as possible.

Here, the specific portion may be a locking part for locking an upper and a lower covers included in the electrical junction box.

According to the configuration described above, a die-releasing hole for forming the locking parts is used as the die-releasing hole. Thus, unnecessary processing of the die can be eliminated as much as possible to contribute to cost reduction.

Here, the depressions and the engagement convex parts may be formed in pairs on the two parallel external side surfaces of the electrical junction box, respectively, and the internal engagement parts may be formed in pairs on the two parallel internal side surfaces of the housing box.

According to the configuration described above, the depressions and the engagement convex parts are formed on the two parallel external side surfaces of the electrical junction box and also the engagement parts are provided on the two internal side surfaces of the housing box. Thus, the electrical junction box can be stably fixed on both sides.

DESCRIPTION OF THE PREFERRED EMBODIMENT

Figure 1:
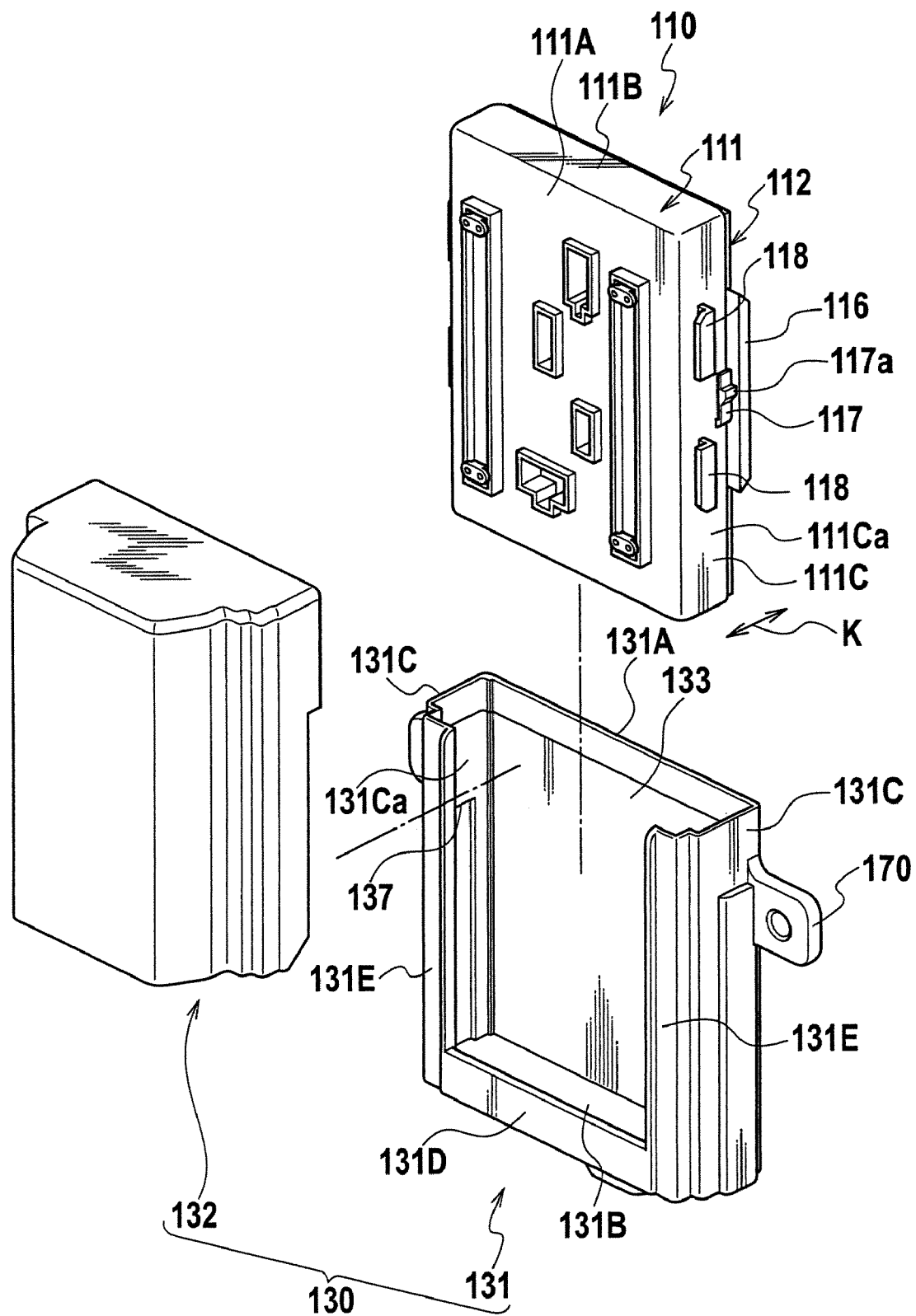
FIG. 1 is a perspective view showing a relationship between a related electrical junction box and a housing box.
Figure 2:
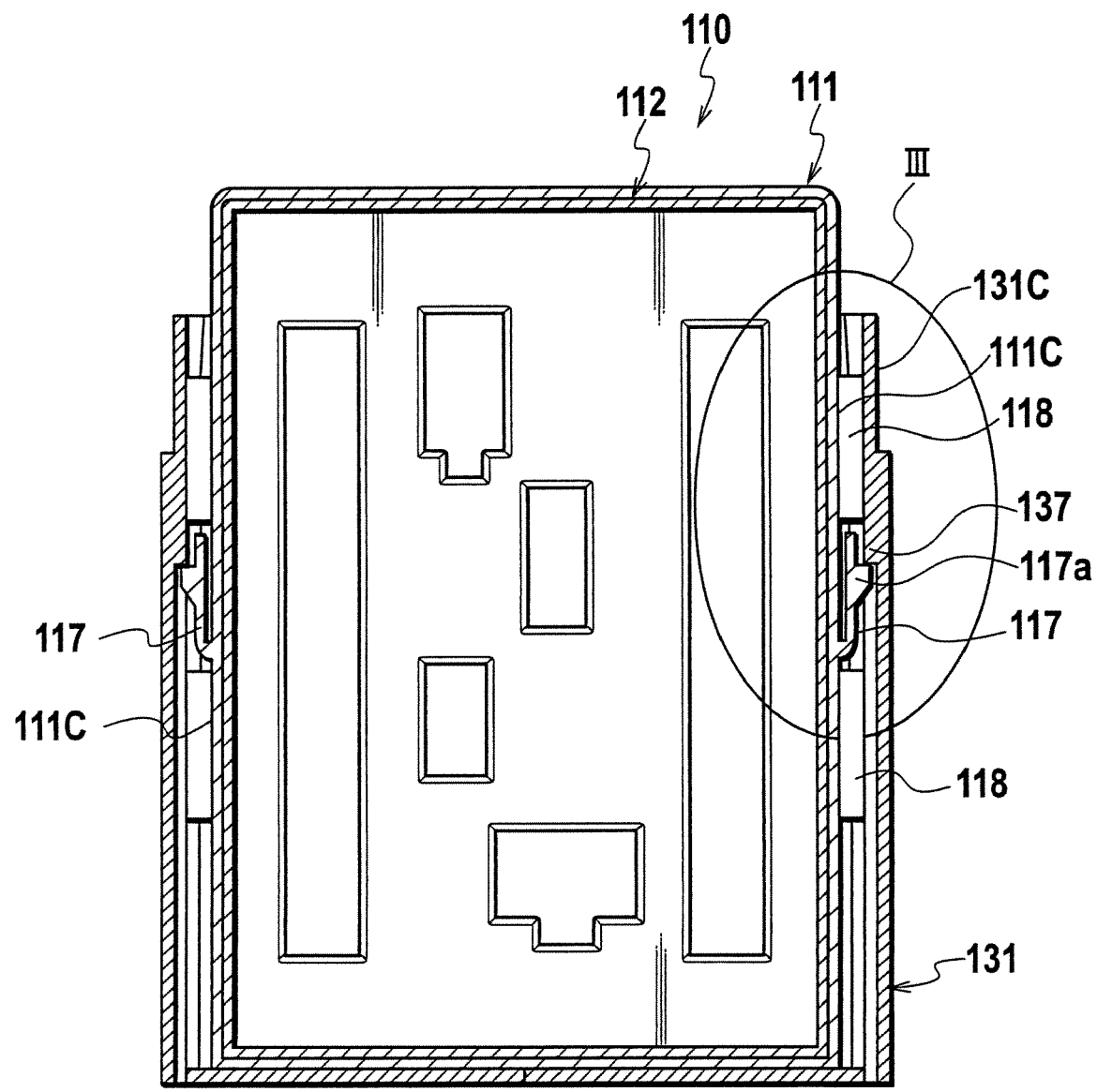
FIG. 2 is a cross-sectional view showing a state where the related electrical junction box is housed in the housing box when viewed from the front.
Figure 3:
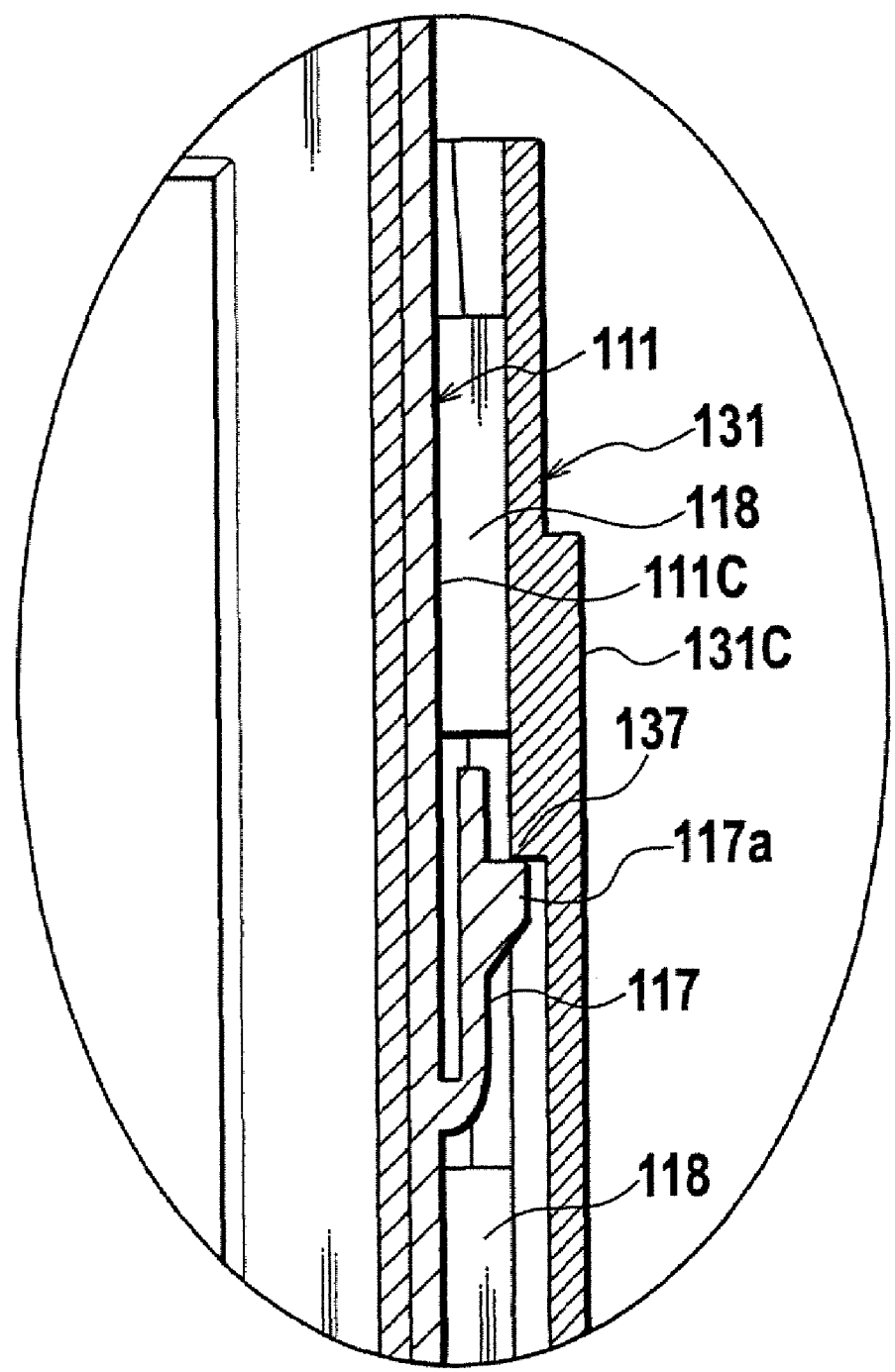
FIG. 3 is an enlarged view of a section III in FIG. 2.

With reference to the drawings, an embodiment of the present invention will be described below. In the following description of the drawings, the same or similar parts will be denoted by the same or similar reference numerals.

Figure 4:
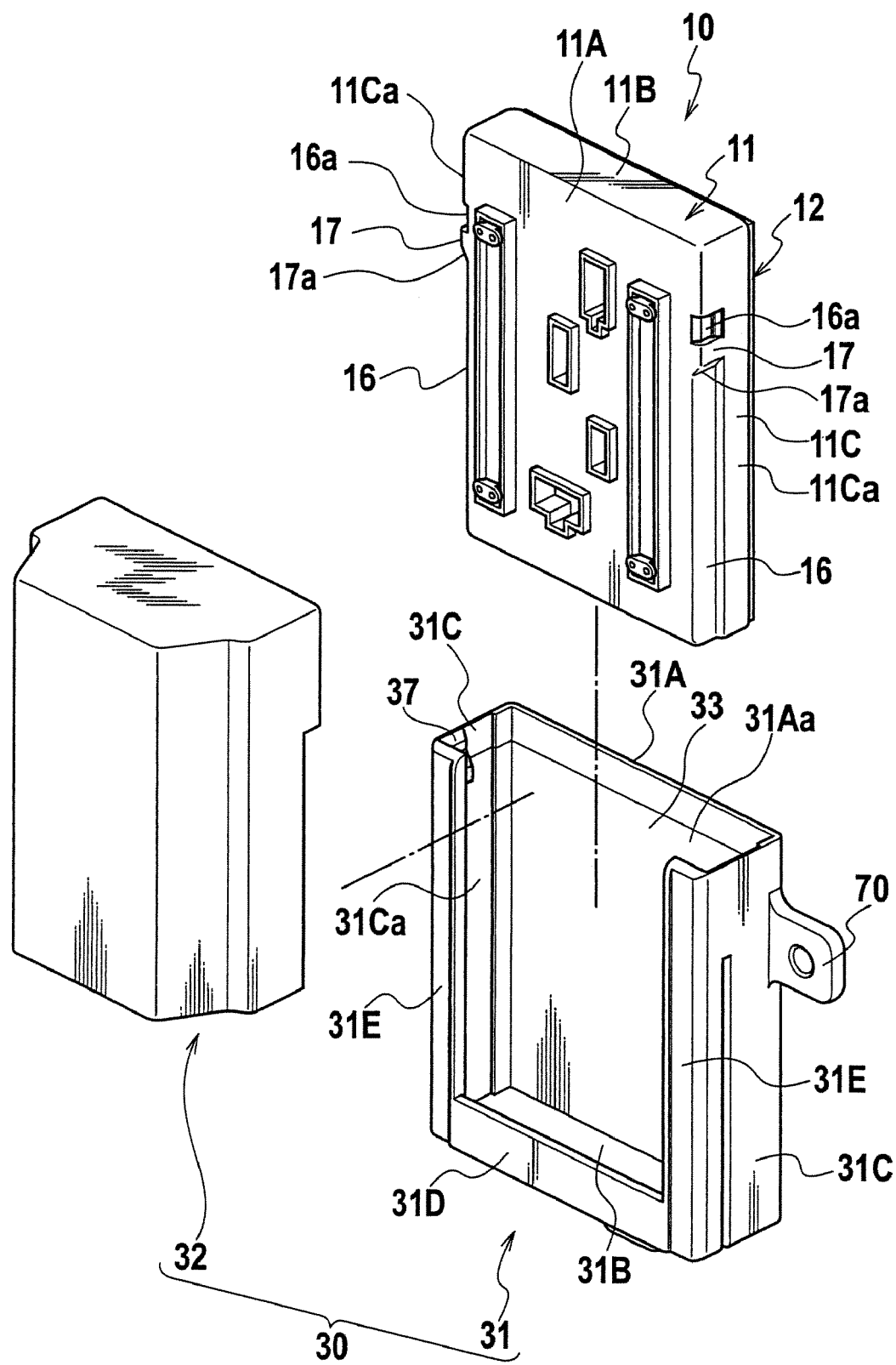
FIG. 4 is a perspective view showing a relationship between an electrical junction box and a housing box according to an embodiment of the present invention.
Figure 5:
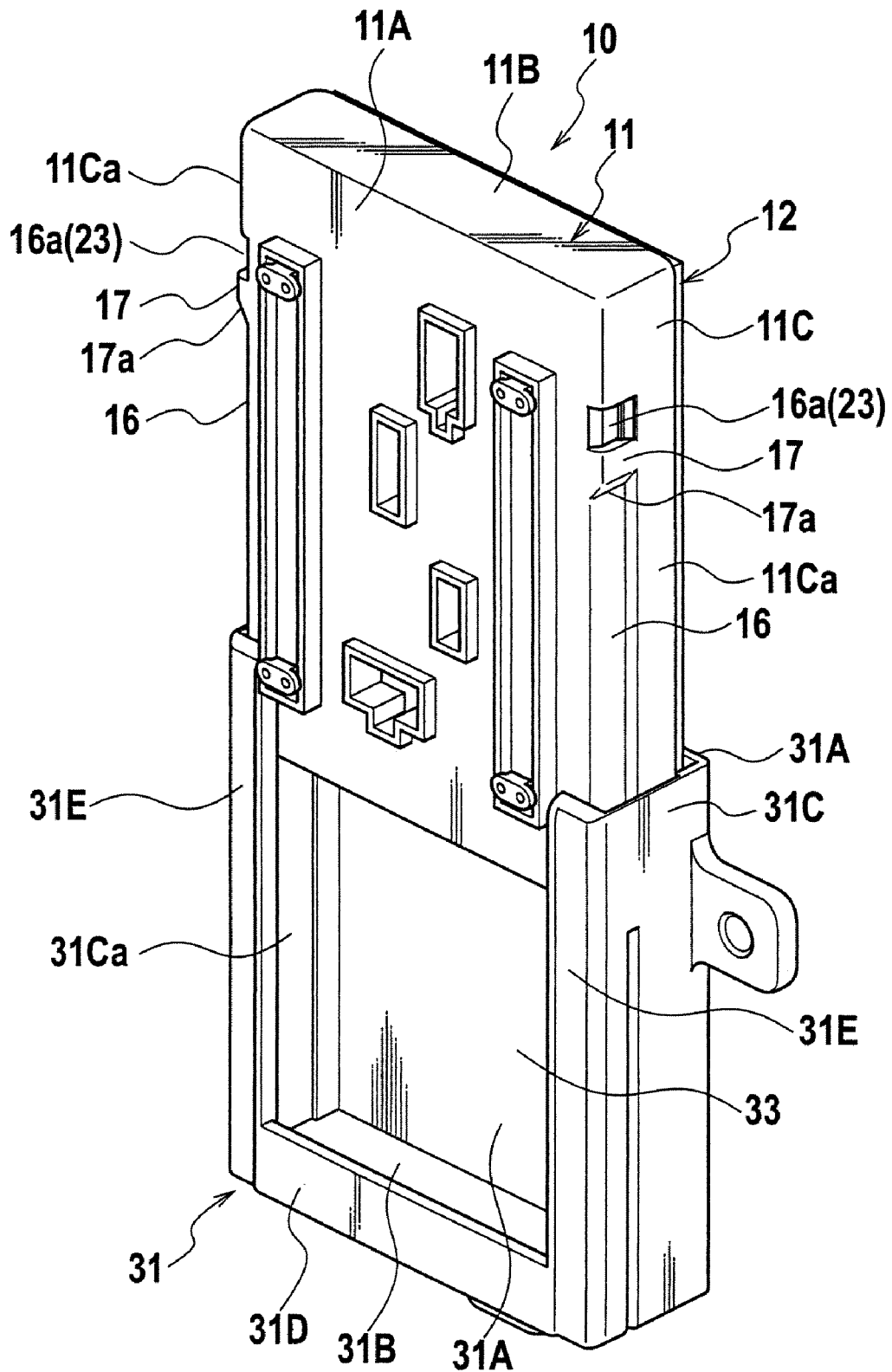
FIG. 5 is a perspective view showing a state where the electrical junction box is being inserted into a lower cover of the housing box according to the embodiment of the present invention.
Figure 6:
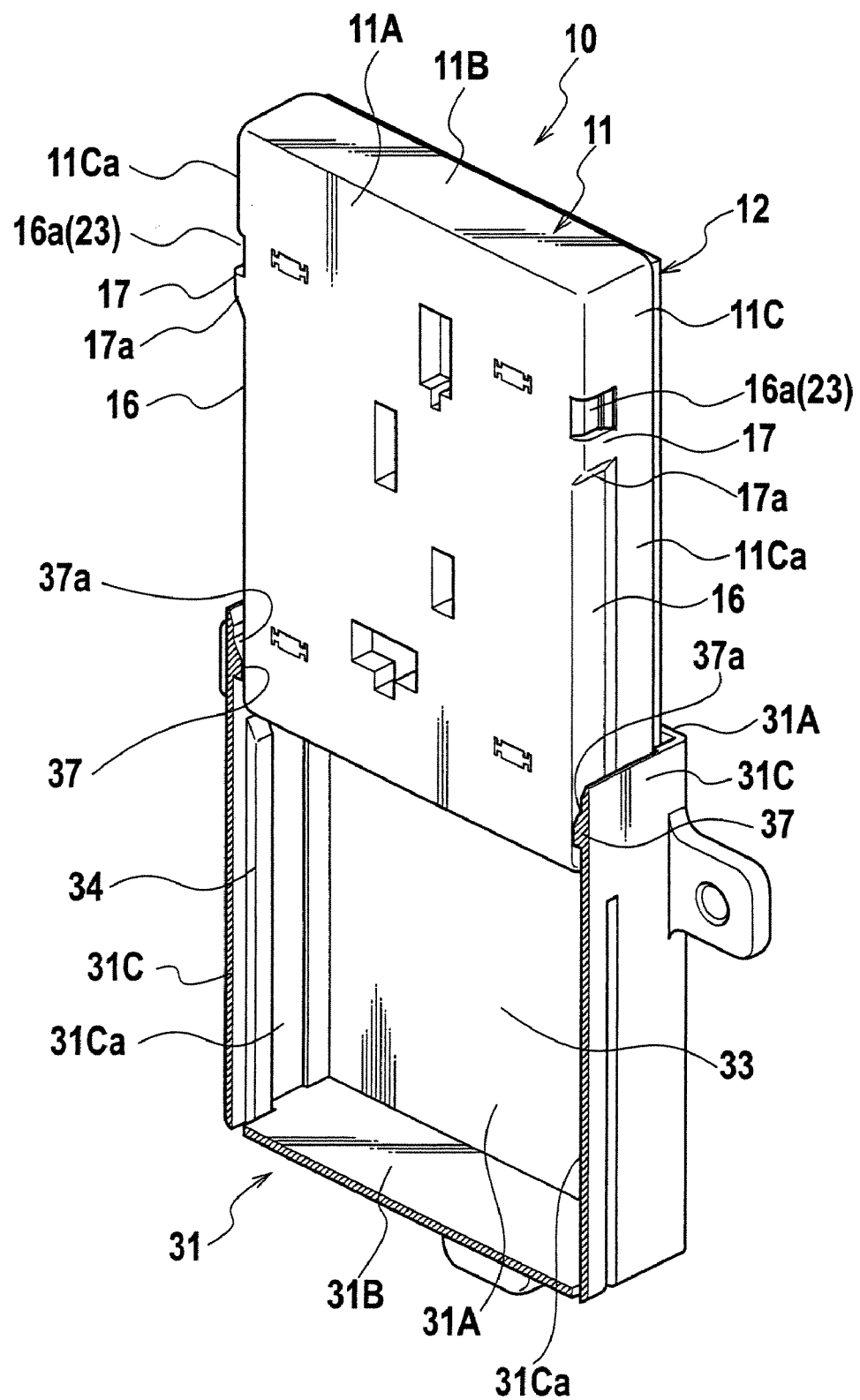
FIG. 6 is a perspective view showing in cross-section main parts in the state shown in FIG. 5.
Figure 7:
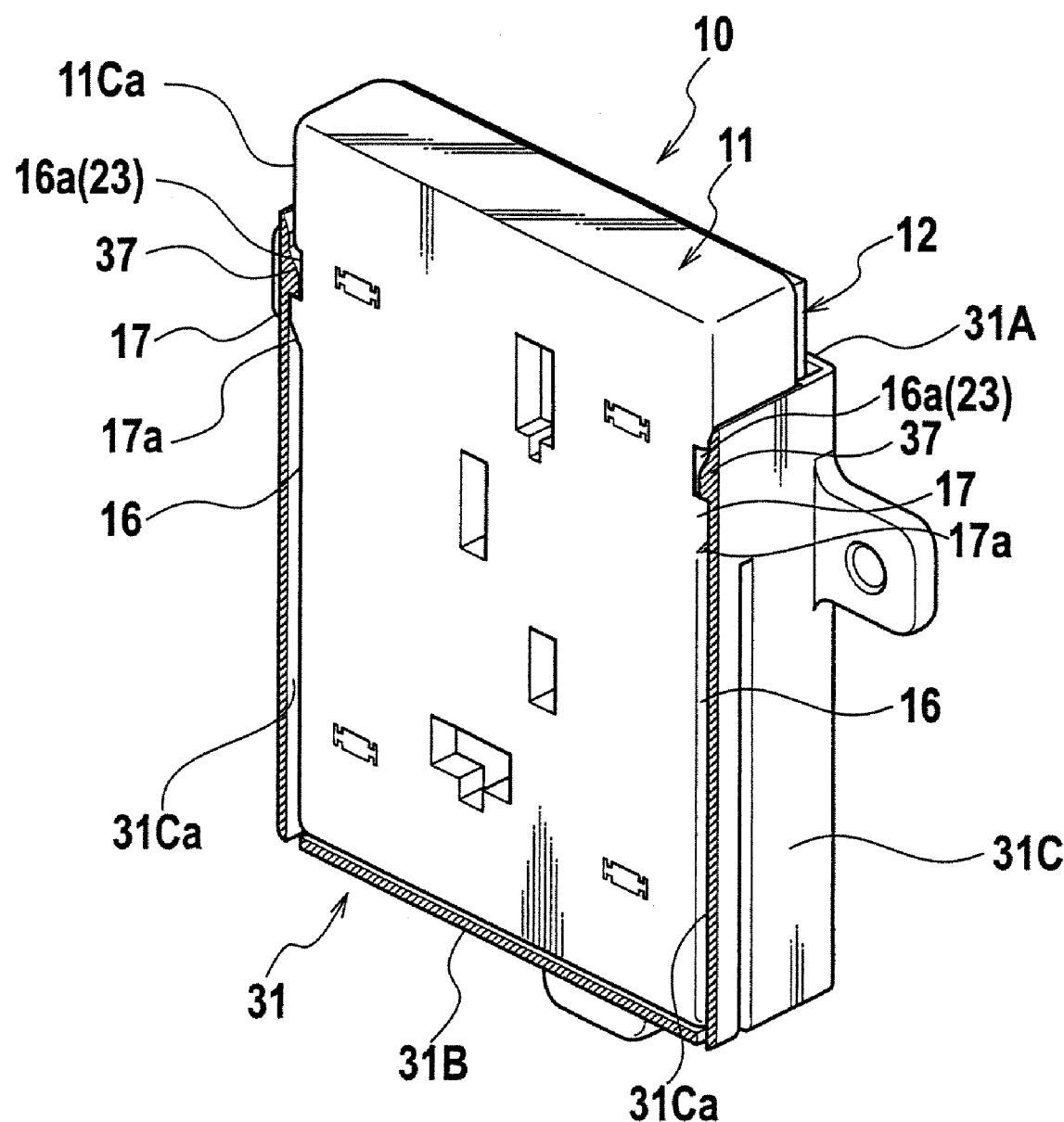
FIG. 7 is a perspective view showing in cross-section the main parts in a state where the electrical junction box is housed in the lower cover of the housing box according to the embodiment of the present invention.
Figure 8:
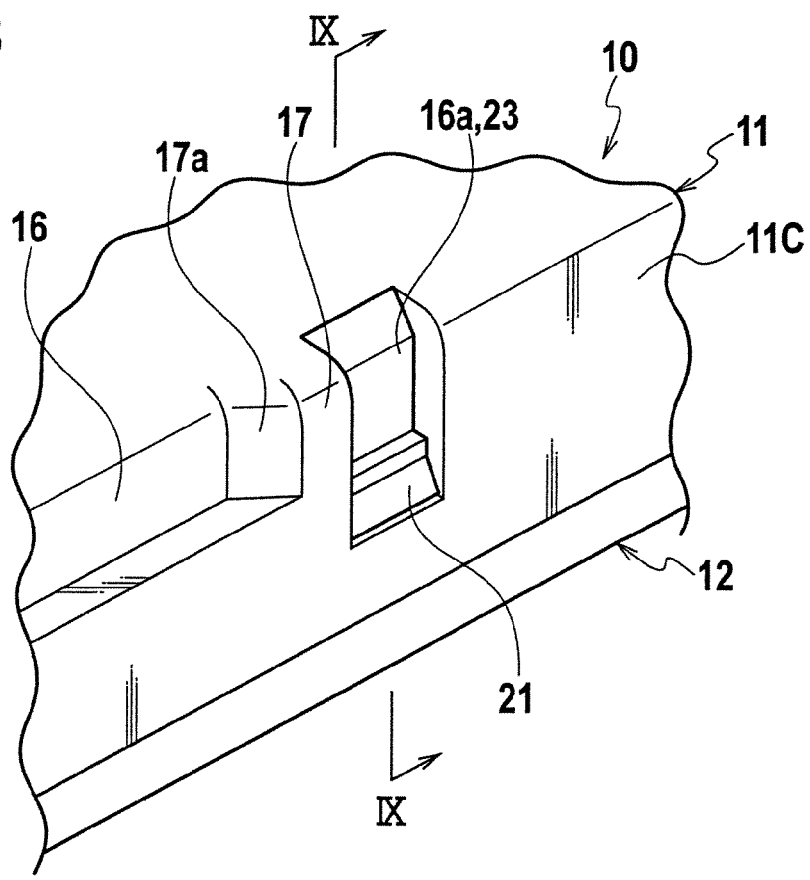
FIG. 8 is an external perspective view showing a structure of locking parts in upper and lower cases of the electrical junction box according to the embodiment of the present invention.
Figure 9:
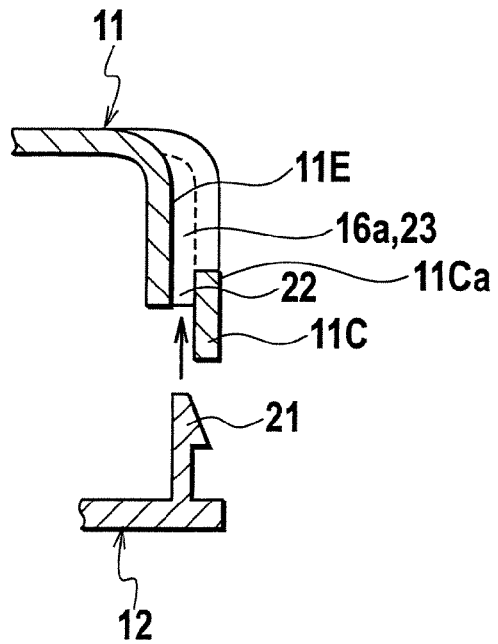
FIG. 9 is a cross-sectional view along the arrow IX-IX in FIG. 8, showing a state before locking.

FIG. 4 is a perspective view showing a relationship between an electrical junction box and a housing box according to the embodiment. FIG. 5 is a perspective view showing a state where the electrical junction box is being inserted into a lower cover of the housing box. FIG. 6 is a perspective view showing in cross-section main parts in the state shown in FIG. 5. FIG. 7 is a perspective view showing in cross-section the main parts in a state where the electrical junction box is housed in the lower cover of the housing box. FIG. 8 is an external perspective view showing a structure of locking parts in upper and lower cases of the electrical junction box. FIG. 9 is a cross-sectional view along the arrow IX-IX in FIG. 8, showing a state before locking.

In FIG. 4, reference numeral 10 denotes the electrical junction box and reference numeral 30 denotes the housing box for housing the electrical junction box 10. On the outside of the housing box 30, a fixing bracket 70 is attached for fixing the housing box to a vehicle body with a bolt.

The electrical junction box 10 has electric components (not shown) housed in a space formed by attaching upper and lower cases 11 and 12 to each other, which are made of resin. The housing box 30 consists of a lower cover 31 (sometimes called a "housing box" by itself) and an upper cover 32 engaged therewith so as to cover a front side of the lower cover.

The upper case 11 of the electrical junction box 10 has a rectangular box shape having a rectangular front wall 11A, upper and lower walls 11B and left and right side walls 11C. Specifically, the upper and lower walls 11B and the left and right side walls 11C are contiguously provided on four sides of the front wall 11A. The upper case 11 also has groove-like depressions 16 and engagement convex parts 17 on outer surfaces (external side surfaces 11Ca) of the left and right side walls 11C.

The groove-like depressions 16 are extended along an insertion direction (a direction from the upper side to the lower side in FIG. 4) of the electrical junction box 10 into the lower cover 31. Each of the engagement convex parts 17 is formed in the middle of an extension direction of the depression 16 in a state where a depression 16a is left on a rear side (upper side) of the insertion direction. The engagement convex part 17 protrudes from a bottom surface of the depression 16 and also has a height not greater than a depth of the depression 16. In this embodiment, the engagement convex part 17 has a height equal to the depth of the depression 16 and also has its top surface at the same level as the external side surface 11Ca.

On front end faces of the engagement convex parts 17 in the insertion direction, as shown in FIG. 6, sloping surfaces 17a are provided, which facilitate passing over engagement parts 37 (internal engagement parts) on the lower cover 31 of the housing box 30.

In this case, the electrical junction box 10 has a rectangular box shape, and the depressions 16 and the engagement convex parts 17 are formed on the two parallel external side surfaces 11Ca of the electrical junction box 10.

As shown in FIGS. 8 and 9, the upper and lower cases 11 and 12 which constitute the electrical junction box 10 are locked to each other by inserting locking projections 21 on the lower case 12 into locking holes 22 on the upper case 11. In the external side surfaces 11Ca of the upper case 11, die-releasing holes 23 for injection molding for forming the locking holes 22 are provided. Specifically, a depressed wall 11E receding inward is provided in a part of each of the side walls 11C, and a portion having the depressed wall 11E provided therein is set to be the die-releasing hole 23 for forming the locking hole 22. In this embodiment, the die-releasing hole 23 is used as the depression 16a behind the engagement convex part 17 in the insertion direction.

As shown in FIG. 4, the lower cover 31 of the housing box 30 consists of a backside wall 31A, a lower wall 31B, left and right side walls 31C, a lower front wall 31D and left and right front walls 31E, all of which surround a space 33 for housing the electrical junction box 10. The lower cover 31 has an opening from its front center portion to its upper surface, which is not covered with the lower front wall 31D and the left and right front walls 31E.

On inner surfaces (internal side surfaces 31Ca) of the left and right side walls 31C, as shown in FIG. 6, engagement projections 37 are provided, which are pressed and deformed by the engagement convex parts 17 in insertion of the electrical junction box 10 to allow passing of the engagement convex parts 17 thereover and are also engaged with rear surfaces of the engagement convex parts 17. The engagement projections 37 on the lower cover 31 are also formed on the respective internal side surfaces 31Ca of the left and right side walls 31C parallel to each other. On the same internal side surfaces 31Ca, guide ribs 34 are provided so as to correspond to the depressions 16 for guiding an operation of inserting the electrical junction box 10.

As in the case of a relationship between the external side surfaces 11Ca of the electrical junction box 10 and the internal side surfaces 31Ca of the lower cover 31, a back surface of the lower case 12 perpendicular to the external side surfaces 11Ca of the upper case 11 having the depressions 16 formed therein and an internal side surface 31Aa of the backside wall 31A of the lower cover 31 of the housing box 30 facing the back surface of the lower case 12 are formed so as to function as guide surfaces for guiding the operation of inserting the electrical junction box 10 into the lower cover 31.

When the electrical junction box 10 is housed in the housing box 30 having the configuration described above, the electrical junction box 10 is inserted into the lower cover 31 from above. Accordingly, the electrical junction box 10 is guided by the internal side surfaces 31Aa and 31Ca of the lower cover 31 and the ribs 34. Thus, the electrical junction box 10 can be smoothly inserted into the space 33 in the lower cover 31.

Moreover, in the insertion of the electrical junction box 10, the engagement convex parts 17 provided on the external side surfaces 11Ca of the electrical junction box 10 and the engagement projections 37 provided on the internal side surfaces 31Ca of the lower cover 31, both of which face each other in parallel with the insertion direction, are engaged with each other. Thus, the electrical junction box 10 is fixed to the lower cover 31 so as to prevent slipping-off thereof.

In this state, the upper cover 32 is placed on the lower cover 31 and locked thereto. Thus, the electrical junction box 10 can be protected in a state of being housed and fixed in the housing box 30.

As described above, according to the housing structure described above, without providing projections directly on the external side surfaces 11Ca of the electrical junction box 10, the depressions 16 extended in the insertion direction of the electrical junction box 10 are formed in the external side surfaces 11Ca of the electrical junction box 10 and the engagement convex parts 17 are provided in the depressions 16 so as not to have a height greater than the depth of the depressions 16. Thus, protrusions on the external side surfaces 11Ca can be eliminated. Therefore, since there are no protrusions, dimensions can be reduced to contribute to space-saving.

Moreover, since the engagement convex parts 17 are formed in the depressions 16, the engagement convex parts 17 are not likely to be deformed or damaged even if the electrical junction box 10 is dropped or hit. Thus, the electrical junction box 10 can be normally fitted into the lower cover 31 of the housing box 30 without rattling. Moreover, it is no longer required to provide guide rails for protecting the engagement convex parts 17. Thus, the electrical junction box 10 can be inserted into the lower cover 31 of the housing box 30 by using the external side surfaces 11Ca having the depressions 16 provided therein directly as the guide surfaces without using projections such as the guide rails. Consequently, there will no longer be a problem in guide performance caused by division of the guide rails due to restrictions in injection molding. As a result, assemblability can be improved.

Since the sloping surfaces 17a are provided on front surfaces of the engagement convex parts 17 in the insertion direction, the engagement convex parts 17 can be smoothly engaged with the engagement projections (engagement parts) 37 on the lower cover 31. Thus, assembling workability can be improved.

In this embodiment, the die-releasing holes 23 for injection molding for forming the locking parts of the electrical junction box 10 are used as the depressions 16 behind the engagement convex parts 17 in the insertion direction. Thus, unnecessary processing of a die can be eliminated as much as possible to contribute to cost reduction.

The depressions 16 and the engagement convex parts 17 are formed on the two parallel external side surfaces 11Ca of the electrical junction box 10 and also the engagement projections 37 are provided on the two parallel internal side surfaces 31Ca of the lower cover 31 of the housing box 30. Thus, the electrical junction box 10 can be stably fixed while keeping a good balance on both left and right sides.

In this embodiment, the electrical junction box 10 can be inserted into the lower cover 31 by using the depressions 16 and the ribs 34 as guides and also using the two surfaces perpendicular to each other as guides. Thus, assembly can be more smoothly performed to improve the assembling workability.

What is claimed is:

1. A structure for housing an electrical junction box in a housing box, comprising:
    an electrical junction box; and
    a housing box which houses the electrical junction box by an insertion of the electrical junction box from an insertion direction;
        wherein an external side surface of the electrical junction box and an internal side surface of the housing box face each other in parallel with the insertion direction,
    wherein the external side surface of the electrical junction box has a groove-like depression extended along the insertion direction and an engagement convex part in an upper portion of the depression in a state where a depression is left on a rear side of the insertion direction, the engagement convex part protruding from a bottom surface of the depression and having a height not greater than a depth of the depression,
        wherein the internal side surface of the housing box has an internal engagement part pressed and deformed by the engagement convex part in insertion of the electrical junction box to the housing box to allow passing of the engagement convex part over the internal engagement part and engaged with a rear surface, in the insertion direction, of the engagement convex part, and
    wherein, when the electrical junction box is housed in the housing box, the engagement convex part and the internal engagement part are engaged with each other to prevent the electrical junction box from slipping off from the housing box.

2. The structure for housing an electrical junction box in a housing box according to claim 1, wherein a front surface, in the insertion direction, of the engagement convex part has a sloping surface facilitating passing of the engagement convex part over the internal engagement part.

3. The structure for housing an electrical junction box in a housing box according to claim 1, wherein a die-releasing hole for injection molding for forming a specific portion of the electrical junction box is used as the depression behind the engagement convex part in the insertion direction.

4. The structure for housing an electrical junction box in a housing box according to claim 3, wherein the specific portion is a locking part for locking an upper and a lower covers included in the electrical junction box.

5. The structure for housing an electrical junction box in a housing box according to claim 1, wherein
    the depressions and the engagement convex parts are formed in pairs on the two parallel external side surfaces of the electrical junction box, respectively, and
    the internal engagement parts are formed in pairs on the two parallel internal side surfaces of the housing box.

* * * * *